United States Patent
Smith et al.

(10) Patent No.: US 10,643,846 B2
(45) Date of Patent: May 5, 2020

(54) SELECTIVE GROWTH OF METAL-CONTAINING HARDMASK THIN FILMS

(71) Applicant: Lam Research Corporation, Fremont, CA (US)

(72) Inventors: David Charles Smith, Lake Oswego, OR (US); Jon Henri, West Linn, OR (US); Dennis M. Hausmann, Lake Oswego, OR (US); Paul C. Lemaire, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/022,503

(22) Filed: Jun. 28, 2018

(65) Prior Publication Data
US 2020/0006073 A1    Jan. 2, 2020

(51) Int. Cl.
*H01L 21/02* (2006.01)
*H01L 21/3105* (2006.01)
*H01J 37/32* (2006.01)
*C23C 16/04* (2006.01)
*C23C 16/24* (2006.01)
(Continued)

(52) U.S. Cl.
CPC ........ *H01L 21/0338* (2013.01); *C23C 16/042* (2013.01); *C23C 16/24* (2013.01); *C23C 16/32* (2013.01); *C23C 16/36* (2013.01); *C23C 16/52* (2013.01); *H01J 37/32449* (2013.01); *H01J 37/32715* (2013.01); *H01L 21/0228* (2013.01); *H01L 21/02175* (2013.01); *H01L 21/02274* (2013.01); *H01L 21/0332* (2013.01); *H01L 21/0335* (2013.01); *H01L 21/0337* (2013.01);
(Continued)

(58) Field of Classification Search
None
See application file for complete search history.

(56) References Cited

U.S. PATENT DOCUMENTS

| 6,632,741 B1 | 10/2003 | Clevenger et al. |
| 8,623,770 B1 | 1/2014 | Gao et al. |

(Continued)

FOREIGN PATENT DOCUMENTS

| KR | 10-0712987 | 5/2007 |
| KR | 10-2007-0066801 | 6/2017 |

OTHER PUBLICATIONS

U.S. Appl. No. 15/432,634, filed Feb. 14, 2017, Smith et al.
(Continued)

*Primary Examiner* — Allan W. Olsen
(74) *Attorney, Agent, or Firm* — Weaver Austin Villeneuve & Sampson LLP

(57) ABSTRACT

Methods and apparatuses for selectively growing metal-containing hard masks are provided herein. Methods include providing a substrate having a pattern of spaced apart features, each feature having a top horizontal surface, filling spaces between the spaced apart features with carbon-containing material to form a planar surface having the top horizontal surfaces of the features and carbon-containing material, selectively depositing a metal-containing hard mask on the top horizontal surfaces of the features relative to the carbon-containing material, and selectively removing the carbon-containing material relative to the metal-containing hard mask and features.

19 Claims, 5 Drawing Sheets

(51) Int. Cl.
*C23C 16/32* (2006.01)
*C23C 16/36* (2006.01)
*C23C 16/52* (2006.01)
*H01L 21/033* (2006.01)

(52) U.S. Cl.
CPC ............. *H01L 21/31055* (2013.01); *H01J 2237/3321* (2013.01)

(56) References Cited

U.S. PATENT DOCUMENTS

| | | | |
|---|---|---|---|
| 8,853,085 B1 * | 10/2014 | Abdallah | H01L 21/3086 438/694 |
| 9,911,595 B1 | 3/2018 | Smith et al. | |
| 2006/0119248 A1 | 6/2006 | Howard et al. | |
| 2006/0273456 A1 | 12/2006 | Sant et al. | |
| 2007/0099431 A1 | 5/2007 | Li | |
| 2007/0148968 A1 | 6/2007 | Kwon et al. | |
| 2009/0280649 A1 * | 11/2009 | Mayer | B23H 5/08 438/676 |
| 2010/0267238 A1 | 10/2010 | Johnson et al. | |
| 2012/0068347 A1 | 3/2012 | Isobayashi et al. | |
| 2012/0115074 A1 | 5/2012 | Zhang et al. | |
| 2012/0171846 A1 | 7/2012 | Hwang | |
| 2012/0244711 A1 | 9/2012 | Yin et al. | |
| 2013/0084688 A1 | 4/2013 | O'Meara et al. | |
| 2014/0094035 A1 | 4/2014 | Ji et al. | |
| 2015/0155198 A1 | 6/2015 | Tsai et al. | |
| 2015/0162416 A1 | 6/2015 | Chang et al. | |
| 2015/0170961 A1 | 6/2015 | Romero et al. | |
| 2015/0200110 A1 | 7/2015 | Li et al. | |
| 2015/0249153 A1 | 9/2015 | Morin et al. | |
| 2015/0251917 A1 | 9/2015 | Hong et al. | |
| 2015/0380419 A1 * | 12/2015 | Gunji-Yoneoka | H01L 21/32134 257/321 |
| 2016/0064224 A1 | 3/2016 | Hung et al. | |
| 2016/0109804 A1 | 4/2016 | Huli | |
| 2016/0225640 A1 | 8/2016 | Raley et al. | |
| 2016/0247678 A1 | 8/2016 | Feng et al. | |
| 2016/0314964 A1 | 10/2016 | Tank et al. | |
| 2016/0336187 A1 | 11/2016 | Liou et al. | |
| 2016/0365425 A1 | 12/2016 | Chen et al. | |
| 2016/0372334 A1 | 12/2016 | Mignot et al. | |
| 2017/0092496 A1 | 3/2017 | deVilliers | |
| 2017/0256402 A1 | 9/2017 | Kaufman-Osborn et al. | |
| 2018/0138040 A1 | 5/2018 | LaVoie | |

OTHER PUBLICATIONS

U.S. Appl. No. 15/453,815, filed Mar. 8, 2017, Smith et al.
U.S. Appl. No. 15/456,301, filed Mar. 10, 2017, Smith et al.
U.S. Appl. No. 15/821,590, filed Nov. 22, 2017, Hausmann et al.
U.S. Appl. No. 15/878,349, filed Jan. 23, 2018, Smith et al.
U.S. Appl. No. 15/975,554, filed May 9, 2018, Smith et al.
PCT International Search Report and Written Opinion dated Oct. 18, 2019, issued in Application No. PCT/US2019/038591.

* cited by examiner

SELECTIVE GROWTH OF METAL-CONTAINING HARDMASK THIN FILMS

BACKGROUND

Semiconductor device fabrication includes fabrication of microprocessors, logic, and memory devices. Such devices may be fabricated using a variety of techniques, including patterning techniques implementing hard masks of various types. Some processes involve formation of structures that include silicon oxide and silicon nitride. Some techniques for forming such structures may be limited to patterning techniques that include both etch and deposition.

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

Provided herein are methods and apparatus for processing substrates. One aspect involves a method including: providing a patterned semiconductor substrate having features spaced apart on an underlying material to be etched; filling spaces between the features with an ashable fill such that top horizontal surfaces of the features are exposed and sidewalls of the features contact the ashable fill; after filling the spaces between the features, selectively depositing a metal-containing hard mask on the exposed top horizontal surfaces of the features relative to the ashable fill; and removing the ashable fill relative to the features and metal-containing hard mask.

In various embodiments, the filling between the features is performed to form a planar surface including the top horizontal surfaces of the features and the ashable fill.

In some embodiments, the filling between the features is done by spin-on. The spin-on may be performed by injecting a carbon-containing fluid mixture onto the patterned semiconductor substrate followed by heat curing. In some embodiments, the filling between the features is done by spin-on followed by planarization to expose the top horizontal surfaces of the features.

In various embodiments, the filling between the features is done by plasma enhanced chemical vapor deposition. The filling between the features further may involve planarizing the patterned semiconductor substrate after the plasma enhanced chemical vapor deposition. For example, the planarizing may be performed by chemical mechanical planarization. In some embodiments, the filling by plasma enhanced chemical vapor deposition involves exposing the features to a hydrocarbon precursor having a formula CxHy, whereby X is an integer between and including 2 and 10, and Y is an integer between and including 2 and 24. For example, the hydrocarbon precursor may include any one or more of methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$). In some embodiments, the filling by plasma enhanced chemical vapor deposition further involves flowing an inert gas mixture, the inert gas mixture including gases such as any of argon, nitrogen, helium, and combinations thereof. In some embodiments, filling by plasma enhanced chemical vapor deposition further involves igniting a plasma at a plasma power between about 100 W and about 10 kW.

In various embodiments, the selectively depositing of the metal-containing hard mask is performed at a substrate temperature between about 200° C. and about 400° C.

In some embodiments, the selectively depositing of the metal-containing hard mask is performed by one or more cycles of atomic layer deposition. For example, one cycle of atomic layer deposition may include both an exposure to a silicon-containing precursor and an exposure to a tungsten-containing precursor. In some cases, a plasma is also ignited at a plasma power sufficient to deposit the metal-containing hard mask without causing bombardment of reactive species onto surfaces of the patterned semiconductor substrate. In some embodiments, the silicon-containing precursor is silane. In some embodiments, the tungsten-containing precursor is a tungsten halide. For example, the tungsten-containing precursor can be any of tungsten hexafluoride, tungsten pentachloride, tungsten hexachloride, and combinations thereof. In some embodiments, one cycle of atomic layer deposition deposits about 2 Å of metal-containing hard mask.

In various embodiments, the selectively depositing is performed for a duration sufficient to deposit a metal-containing hardmask to a thickness between about 50 Å and about 1000 Å.

The method may also include etching the underlying material using the features as a mask. In some embodiments, the thickness of the metal-containing hard mask deposited is selected depends on chemistry used to etch the underlying material.

In various embodiments, the features contain a dielectric material. An example dielectric material is silicon oxide. Another example dielectric material is silicon nitride. In various embodiments, the features contain silicon. For example, in one embodiment, the features contain polysilicon.

In various embodiments, the metal-containing hard mask includes tungsten. For example, the metal-containing hard mask may be any of tungsten, tungsten carbide, tungsten carbonitride, and combinations thereof.

In various embodiments, spaces between features have an aspect ratio of at least about 4:1.

In some embodiments, the height of one of the features as measured from the top horizontal surface to surface of the underlying material to be etched is at least about 100 Å.

In various embodiments, the filling is performed at a substrate temperature of at least about 150° C.

In some embodiments, the removing of the ashable fill includes exposing the patterned semiconductor substrate to an oxygen-containing or hydrogen-containing plasma.

In various embodiments, removing of the ashable fill is performed without applying a bias.

In some embodiments, the filling is performed in a chamber having a chamber pressure between about 5 mTorr and about 10 Torr.

Another aspect involves an apparatus including: a process chamber including a showerhead and a substrate support, a plasma generator, and a controller having at least one processor and a memory, whereby the at least one processor and the memory are communicatively connected with one another, the at least one processor is at least operatively connected with flow-control hardware, and the memory stores machine-readable instructions for: causing introduction of flow of a carbon-containing deposition precursor and causing generation of a first plasma; after causing introduction of the carbon-containing deposition precursor, causing stopping of the flow of the carbon-containing deposition precursor; and after stopping the flow of the carbon-containing deposition precursor, causing introduction of temporally separated pulses of a silicon-containing precursor flow and a tungsten-containing precursor flow.

These and other aspects are described further below with reference to the drawings.

DETAILED DESCRIPTION

Figure 1:
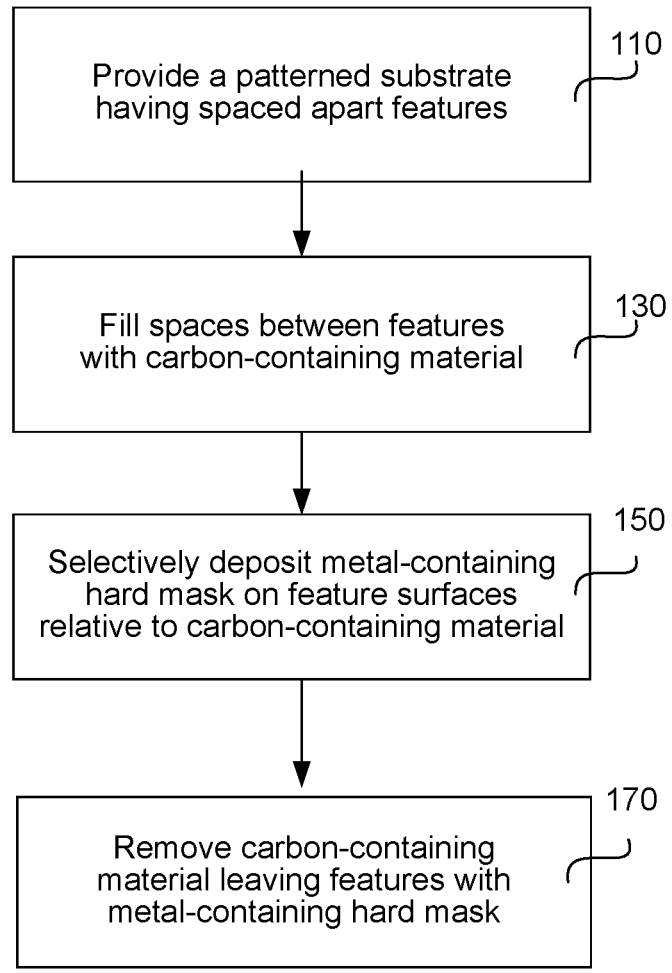
FIG. 1 is a process flow diagram depicting operations performed in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

In semiconductor processing, masking methods are used to pattern and etch substrates. As substrate aspect ratios increase, the demand for highly selective hard masks increases. Various patterning schemes involve formation of positive features, such as dielectric spacers, to be used as a mask for etching a target layer. However, some dielectric spacers may be susceptible to erosion, particularly where the aspect ratio of gaps between the dielectric spacers is very large and the depth of the gaps may therefore be large, which may result in longer etching durations to etch the target layer under the dielectric spacers. Thus, some dielectric spacers may erode during etching of the target layer.

In some cases, dielectric spacers also include an additional hard mask over the dielectric spacer, which can withstand etching conditions for etching the target layer while maintaining the profile of the pattern. Masks that have high etch selectivity and yet are easy to remove without damage to the substrate are useful in processing substrates. In particular, metal-containing hard masks have significant advantages in front end technology development. Hard masks that include metal can withstand a variety of etching chemistries to protect dielectric spacers during etching of a target layer. One type of metal-containing hard mask is titanium nitride. However, in some cases, when titanium nitride is used as a hardmask, a titanium fluoride ($TiF_x$) may form, which is difficult to remove from both chamber components and exposed surfaces of the substrate.

Another type of metal-containing hard mask is a tungsten-containing hard mask, such as tungsten metal, tungsten carbide, tungsten nitride, or tungsten carbonitride. These materials have improved etch product volatility, improved grain size for line width roughness reduction, and improved etch selectivity compared to exposed dielectric materials when exposed to etching chemistries, thereby functioning as an effective hard mask. For example, etch selectivity of tungsten metal relative to silicon oxide material when exposed to fluorine-containing etch chemistries may exceed at least about 10:1. Additionally, tungsten-containing hard masks are less susceptible to forming nonvolatile materials that may be difficult to remove; instead, the hard masks may form tungsten fluoride, which is volatile at the process conditions for etching when the tungsten-containing hard masks are used as masks. Tungsten-containing hard masks also grow in larger grain sizes which may be formed using various deposition techniques and process conditions, and in some cases may improve line bending concerns.

One method for forming tungsten-containing hard masks is by chemical vapor deposition (CVD), which may be performed thermally or using plasma (plasma-enhanced chemical vapor deposition, or PECVD). As devices shrink, critical dimensions are reduced and aspect ratios are increased for more advanced technologies. In some cases, CVD or PECVD techniques may yield fields that close the features at desired thicknesses, causing the formation of voids. While voids can be avoided by depositing thinner films, such thin films may not be sufficient for the tungsten-containing hard mask to act as a hard mask due to sputter loss during etching, and the hard mask may be degraded during etching, thereby degrading the etching profile. Additionally, CVD-deposited tungsten-containing hard masks can reduce the critical dimension of the gap between features, thereby reducing the aspect ratio. Additionally, CVD or PECVD of tungsten-containing hard masks on patterned features results in deposition not only at the bottoms of gaps between features but also on sidewalls of the features, thereby reducing the aspect ratio and degrading the feature profile. Some CVD and PECVD techniques may not preferentially deposit on the top horizontal surfaces of features relative to sidewalls of the features.

Provided herein are methods and apparatuses for selectively depositing a metal-containing hard mask on a patterned feature. The patterned features may be dielectric material with high aspect ratio gaps or spaces between the patterned features, each patterned feature having a top horizontal surface, and metal-containing hard masks may be selectively deposited on the top horizontal surface relative to other exposed surfaces on the substrate. Selectivity in some embodiments is achieved by forming carbon-containing and/or ashable material between the patterned features, where the metal-containing hard mask can be selectively deposited on the top horizontal surfaces of the patterned features relative to exposed carbon-containing surfaces. Certain disclosed embodiments involve filling in gaps between the patterned features with ashable material, optionally planarizing the substrate to expose the dielectric on the top horizontal surface of the patterned features, and selectively depositing metal-containing hard mask material on the exposed dielectric on the top horizontal surfaces of the patterned features relative to ashable material.

Certain disclosed embodiments allow for deposition of, for example, tungsten-containing hard masks to a thickness sufficient for the tungsten-containing hard mask to withstand subsequent etching chemistries and function as an effective hard mask, and deposition techniques allow adequate feature opening between patterned features to provide sufficient space for subsequent etching operations. That is, in some embodiments where materials are deposited on a patterned feature without filling with a carbon-containing material, some material may be deposited on sidewalls of the feature, thereby reducing the size of the opening between patterned features. In certain disclosed embodiments, the opening between patterned features is maintained, since the space between the features is filled with carbon-containing material prior to depositing a metal-containing hard mask, and the carbon-containing material can be removed after depositing the metal-containing hard mask, leaving the size of the opening between features substantially the same before and after deposition of the metal-containing hard mask.

FIG. 1 is a process flow diagram depicting operations performed in accordance with certain disclosed embodiments. Operations 110-170 may be performed in a process chamber set to a chamber pressure between about 1 mTorr and about 10 Torr. In some embodiments, the process chamber includes a pedestal set to a temperature between about 75° C. and about 600° C. In some embodiments, operations in FIG. 1 are performed at different temperatures. For example, in some embodiments, operation 130 is performed at a temperature different from that of operation 150. In some embodiments, operation 150 is performed at a temperature between about 75° C. and about 600° C., or between about 50° C. and about 300° C.

In operation 110, a patterned substrate having spaced apart features is provided. The substrate may be a silicon wafer, e.g., a 200-mm wafer, a 300-mm wafer, or a 450-mm wafer, including wafers having one or more layers of material, such as dielectric, conducting, or semi-conducting material deposited thereon. Non-limiting examples of underlayers include dielectric layers and conducting layers, e.g., silicon oxides, silicon nitrides, silicon carbides, metal oxides, metal nitrides, metal carbides, and metal layers. The substrate may include a target layer to be etched using the pattern of spaced apart features. The pattern on the substrate includes the spaced apart features. The spaced apart features may be pillars on the substrate. In various embodiments, the spaced apart features are positive features.

The features on the substrate may be patterned silicon-containing material. For example, in some embodiments, the features include silicon oxide material. In some embodiments, the features include silicon nitride material. In some embodiments, the features include silicon. For example, the features may be polysilicon. In some embodiments, the features include silicon carbide material.

Certain disclosed embodiments are suitable for selective deposition on features of a variety of sizes and are not limited to deposition on features having specific heights.

In some embodiments, the space between the features may be trenches across the surface of the substrate. In some embodiments, from a top view of the features looking down onto the plane of the substrate, each feature has a rectangular cross section. From a side view of the features looking across the substrate surface, the features may have a height between about 100 Å and about 5 microns, where the height is measured from the bottom of the feature to a top horizontal surface of the feature. The bottoms of the features are adjacent to a target layer, whereby sidewalls of the features meet a horizontal surface of the target layer at 90°±5°. The top horizontal surface of a feature may meet sidewalls of the features at 90°±5°.

In various embodiments, spaces between the features have an aspect ratio between about 2:1 and about 20:1, or at least about 4:1, or about 4:1. The distance between features (which may be referred to herein as a critical dimension), or the size of the gaps between the features, may be less than about 40 nm.

Figure 2:
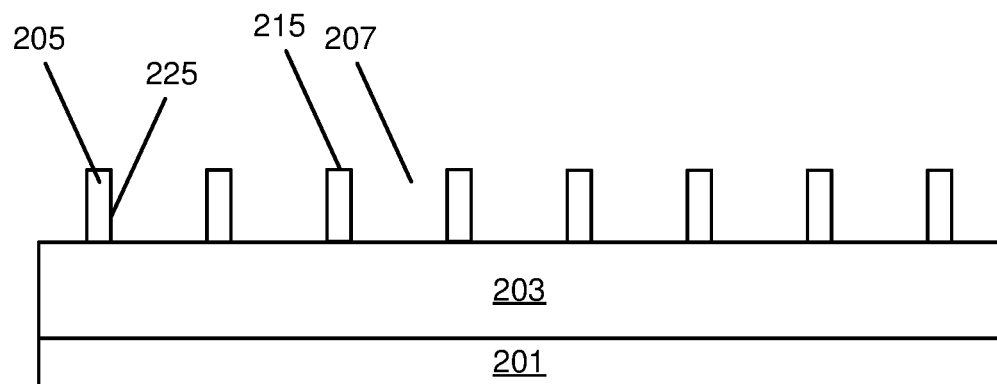
FIGS. 2-6 are schematic illustration of substrates undergoing operations of certain disclosed embodiments.

FIG. 2 provides an example schematic illustration from a side view of a substrate 201 having a target layer 203 and spaced apart features 205, with gaps 207 between the features. The gaps may be defined by the space between adjacent sidewalls 225 of the spaced apart features 205. Each spaced apart feature 205 may have a top horizontal surface 215.

Returning to FIG. 1, in operation 130, spaces between the features are filled with carbon-containing material. In various embodiments, the spaces between the features are filled with an "ashable fill" which refers to a fill that can be removed by oxygen or hydrogen plasma. Filling of the spaces between the features may be performed by one of various techniques. One example technique is spin-on. In spin-on, a liquid is spun onto the substrate by injecting a carbon-containing and/or carbon-and-silicon-containing mixture via a nozzle onto the substrate. In some embodiments, following flow of the fluid, the substrate is subject to curing at a temperature or about 250° C. which may shrink and densify the deposited carbon-containing material.

Another example technique is PECVD. In PECVD, the substrate is exposed to a carbon-containing deposition precursor and a plasma is ignited. During PECVD, the substrate is exposed to continuous flow of the carbon-containing deposition precursor and the plasma is ignited in situ. In some embodiments, the carbon-containing deposition precursor is ignited in a plasma in a remote plasma generator or upstream of the substrate to form excited species which are then delivered to a process chamber to deposit onto the substrate.

The carbon-containing deposition precursor may be a hydrocarbon. The hydrocarbon may be one defined by the formula $C_xH_y$, whereby X is an integer between and including 2 and 10, and Y is an integer between and including 2 and 24. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$).

In some embodiments, two or more hydrocarbon precursors may be introduced. In addition to hydrocarbon precursors, a carrier gas may be used to dilute the precursor gas flow. The carrier gas may be any suitable carrier gas, including helium (He), argon (Ar), nitrogen ($N_2$), hydrogen ($H_2$), or a combination of any of these. In some embodiments, the hydrocarbon is flowed with a mixture of argon, nitrogen, and helium. The ratio of carrier gas flow to hydrocarbon precursor gas flow may vary by tool used to introduce the hydrocarbon precursor gas. The ratio of carrier gas flow to hydrocarbon precursor gas flow depend on gas delivery type, spacing, and volume, and may impact uniformity of the deposited carbon-containing material and particle performance.

In some embodiments, the carbon-containing deposition precursor also includes atoms other than carbon and hydrogen. Other example carbon-containing deposition precursors include amines (such as t-butylamine, triethylamine, methylamine, etc.) and alcohols (such as ethanol, t-butanol, etc.).

Precursor gas flow rates depend on the particular deposition chamber and substrate. Examples of flow rates used for four 300 mm substrates are between about 200 sccm and about 4,000 sccm of acetylene, between about 1,000 sccm and about 20,000 sccm of hydrogen, and between about 1000 sccm and about 20,000 sccm of helium.

While the carbon-containing deposition precursor is introduced, a plasma is ignited using a dual RF plasma source that includes a low frequency (LF) component and a high frequency (HF) component. In some embodiments, the methods of the embodiments use LF RF power to generate high energy ion bombardment. Low frequency RF power refers to an RF power having a frequency between about 100 kHz and about 2 MHz or about 400 kHz. In some embodiments, pulsing frequency may be limited by the operation capability of the LF generator. In some embodiments, LF RF power has an RF power with a frequency of about 400 kHz, for example 430 kHz. During deposition, in some embodiments, the LF power ranges between about 0.001 W/cm² and about 0.05 W/cm², as expressed in W per cm² of substrate surface area. In some embodiments, the LF power ranges between about 0 and about 1.25 W/cm². High frequency RF power refers to an RF power having a frequency between about 2 MHz and about 60 MHz. In some embodiments, HF RF power has an RF power with a frequency of about 13.56 MHz. During deposition, in some embodiments, the HF power per substrate area ranges between about 0.001 W/cm² and about 0.05 W/cm². In some embodiments, the HF power per substrate area ranges between about 0.05 W/cm² to 1.25 W/cm². In some embodiments, for a 4-station chamber, the plasma power may be between about 100 W and about 10 kW. The plasma power may also depend on the size of the chamber.

The flow rates and RF powers disclosed herein are for a four-station tool configured for 300 mm wafers. Power levels and flow rates generally scale linearly with the number of stations and substrate area. The flow rates and powers may be represented on a per area basis, e.g., 2500 W may also be represented as 0.884 W/cm².

During operation 130, the deposition process may be self-limiting in some embodiments. For example, in some embodiments, deposition of carbon-containing material may slow down as the spaces are filled and the thickness of carbon-containing material deposited in the spaces approaches the height of the features. In some embodiments, trials are performed to determine the duration sufficient to deposit enough carbon-containing material to stop deposition before covering the top horizontal surfaces of the features with carbon-containing material.

In some embodiments, following deposition, if some of the top horizontal surfaces of the features are covered with some carbon-containing material, a cleaning or planarization operation may be performed to expose the top horizontal surfaces of the features. An example cleaning operation is chemical mechanical planarization. Cleaning may be performed by exposing the substrate to hydrogen plasma or oxygen plasma to remove carbon-containing material on the top horizontal surfaces of the features. In many embodiments, hydrogen plasma is used as it is easier to control. Hydrogen plasma cleaning conditions may depend on the tool. In some embodiments, the temperature of the pedestal during hydrogen plasma cleaning is between about 75° C. and about 600° C. In some embodiments, the chamber pressure during hydrogen plasma cleaning may be between about 1 mTorr and about 10 Torr. In various embodiments, the substrate following operation 130 includes a planar surface across the substrate, the planar surface having the top horizontal surfaces of the features and the carbon-containing material filled in spaces between the spaced apart features. That is, the planar surface includes carbon-containing material that is flush with the top horizontal surfaces of the features.

In some embodiments, the carbon-containing material deposited in the spaces is an amorphous carbon layer. In some embodiments, the carbon-containing material is an amorphous carbon layer having trace amounts of hydrogen and nitrogen in the amorphous carbon.

The carbon-containing material is a sacrificial material. In various embodiments, the carbon-containing material is deposited such that it covers sidewalls of the features but not the top horizontal surfaces of the features. In some embodiments, the carbon-containing material is deposited to fill the spaces, or gaps, between sidewalls of the feature and optional cleaning and/or planarization operations may be performed to expose the top horizontal surfaces of the features. In some embodiments, the carbon-containing material completely fills the gaps between the patterned, spaced apart features. In some embodiments, it may not be necessary to completely fill the spaces between the patterned features, so long as the top horizontal surfaces of the features is flush with carbon-containing material and no sidewalls of the features are exposed during deposition of the metal-containing hard mask.

Figure 3:
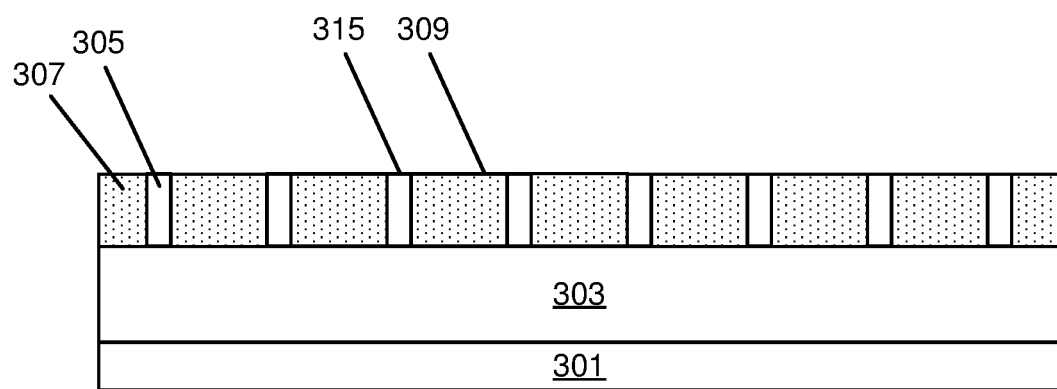

FIG. 3 shows an example substrate 301 having a target layer 303 with features 305 and a carbon-containing material 307 deposited between the features 305 to fill the gaps. The carbon-containing material 307 shown in FIG. 3 is deposited to a thickness up to the height of the features 305, resulting in a planar surface 309 having the carbon-containing material 307 and exposed top horizontal surfaces 315 of the features 305.

Returning to FIG. 1, in operation 150, a metal-containing hard mask is deposited selectively on the top horizontal surfaces of the features relative to the carbon-containing material. Selective deposition may refer to faster nucleation on one surface relative to a second surface. For example, the nucleation delay may result in a deposition thickness difference between about 10 Å and about 100 Å. While the deposition rate of the metal-containing hard mask on both the features and the carbon-containing material may be the same once deposition begins, selective deposition may be achieved because the nucleation delay of depositing a metal-containing hard mask on the carbon-containing surface is greater than the nucleation delay on the feature surface, thereby resulting in thicker deposition on the feature surface relative to the carbon-containing surface.

In various embodiments, the metal-containing hard mask material is a tungsten-containing material. Example tungsten-containing materials include but are not limited to tungsten metal, tungsten carbide, and tungsten carbonitride. Since the selectivity depends on the nucleation delay on the relative materials, one method of modulating the selectivity is by modulating the composition of the relative materials. In some embodiments, modulating the amount of tungsten used in a tungsten-containing hard mask material may adjust the selectivity. Further, the amount of tungsten may also adjust the transparency of the film, which may be desired in some embodiments for imaging in lithography.

In various embodiments, the metal-containing hard mask material contains aluminum. For example, the metal-containing hard mask may be aluminum oxide. In various embodiments, the metal-containing hard mask material contains tin.

The material and thickness of the metal-containing hard mask depends on the conditions that it is subsequently exposed to when etching a target layer using the metal-containing hard mask as a mask. For example, a chlorine-containing etching chemistry may be used to etch a poly-silicon target layer, and since the chlorine-containing etching chemistry is highly selective to a tungsten material, a thin tungsten hard mask may be used. In another example, a fluorine-containing etching chemistry may be used to etch an oxygen-containing target layer, and while etching can be performed selectively to etch the oxygen-containing target layer at a faster rate than the tungsten hard mask, the tungsten hard mask may be etched during the etching, and thus a thicker tungsten hard mask may be used.

The metal-containing hard mask material is deposited on top horizontal surfaces of the features at a faster deposition rate than on the carbon-containing material. As a result, thicker deposition is observed on the exposed top horizontal surfaces of the features. In various embodiments, the material of the top horizontal surfaces is a silicon-containing material. Without being bound by a particular theory, it is believed that the deposition chemistry used for depositing the metal-containing hard mask does not nucleate easily on carbon-containing surfaces, while the deposition chemistry nucleates on dielectric surfaces, allowing selective deposition on the dielectric relative to the carbon-containing surface.

The metal-containing hard mask is deposited to a thickness between about 50 Å and about 1000 Å. In various embodiments, the metal-containing hard mask is deposited to a thickness between about 25 Å and about 300 Å. A metal-containing hard mask deposited to a thickness greater than about 1000 Å may result in growth of the metal-containing hard mask in all directions, thereby blocking the space between features and causing pinch-off. Deposition is performed to maintain the critical dimension of the gap between the features.

Selective deposition in operation 150 may be performed by atomic layer deposition (ALD). ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a silicon oxide deposition cycle may include the following operations: (i) delivery/adsorption of a silicon-containing precursor, (ii) purging of the silicon precursor from the chamber, (iii) delivery of a tungsten-containing reactant, and (iv) purging of the tungsten-containing reactant from the chamber.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon-containing precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. Purging the chamber may involve flowing a purge gas or a sweep gas, which may be a carrier gas used in other operations or may be a different gas. In some embodiments, purging may involve evacuating the chamber. Example purge gases include argon, nitrogen, hydrogen, and helium. In some embodiments, operation 306 may include one or more evacuation subphases for evacuating the process chamber. In some implementations, the chamber may not be fully evacuated. For example, the chamber may be evacuated such that the partial pressure of the first precursor in gas phase is sufficiently low to mitigate a reaction. In some embodiments, the purging may be optional.

A second reactant, such as a tungsten-containing reactant, is introduced to the chamber so that some of these molecules react with the first precursor adsorbed on the surface. In some processes, the second reactant reacts immediately with the adsorbed first precursor. The chamber may then be evacuated again to remove unbound second reactant molecules. As described above, in some embodiments the chamber may not be completely evacuated. Additional ALD cycles may be used to build film thickness. One cycle may deposit about 2 Å of metal-containing hard mask material.

In some embodiments, an optional plasma may be ignited during introduction of the second reactant. For example, a low power plasma may be used to prevent sputtering. In some embodiments, LF RF power has an RF power with a frequency of about 400 kHz, for example 430 kHz. During deposition, in some embodiments, the LF power ranges between about 200 W and about 3000 W for four 300 mm substrates in a 4-station chamber. High frequency RF power refers to an RF power having a frequency between about 2 MHz and about 60 MHz. In some embodiments, HF RF power has an RF power with a frequency of about 13.56 MHz. During deposition, in some embodiments, the HF power per substrate area ranges between about 400 W and about 2500 W for four 300 mm substrates in a 4-station chamber. The plasma power may also depend on the size of the chamber.

The flow rates and RF powers disclosed herein are for a four-station tool configured for 300 mm wafers. Power levels and flow rates generally scale linearly with the number of stations and substrate area. The flow rates and powers may be represented on a per area basis, e.g., 2500 W may also be represented as 0.884 W/cm$^2$.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

Where the metal-containing hard mask deposited is tungsten metal, one example ALD cycle may include exposing of the substrate to a silicon-containing reactant, such as silane, which may form an adsorbed layer of the silicon-containing reactant, purging of a process chamber housing the substrate, exposing of the substrate to a tungsten halide, such as tungsten hexafluoride, which reacts with the adsorbed layer of the silicon-containing reactant to form tungsten, and purging of the process chamber.

Where the metal-containing hard mask deposited is tungsten carbide, one example ALD cycle may include exposing of the substrate to a silicon-containing reactant, such as silane, which may form an adsorbed layer of the silicon-containing reactant, purging of a process chamber housing the substrate, exposing of the substrate to a metal-organic tungsten precursor, which reacts with the adsorbed layer of the silicon-containing reactant to form tungsten carbide, and purging of the process chamber.

Where the metal-containing hard mask deposited is tungsten carbonitride, one example ALD cycle may include exposing of the substrate to a silicon-containing reactant, such as silane, which may form an adsorbed layer of the silicon-containing reactant, purging of a process chamber housing the substrate, exposing of the substrate to a tungsten precursor such as a metal-organic tungsten precursor and a nitrogen-containing reactant such as nitrogen gas, which react with the adsorbed layer of the silicon-containing reactant to form tungsten carbonitride, and purging of the process chamber. In some embodiments, the tungsten precursor has amine or amide groups.

Where the metal-containing hard mask deposited is tungsten nitride, one example ALD cycle may include exposing of the substrate to a silicon-containing reactant, such as silane, which may form an adsorbed layer of the silicon-containing reactant, purging of a process chamber housing the substrate, exposing of the substrate to a mixture of a nitrogen-containing gas and a tungsten precursor, which reacts with the adsorbed layer of the silicon-containing reactant to form tungsten nitride, and purging of the process chamber. In some embodiments, the tungsten precursor has amide groups. In some embodiments, the nitrogen-containing gas in the mixture with the tungsten precursor is nitrogen gas.

In some embodiments, the nitrogen-containing gas reactant or mixture of reactants that includes at least one nitrogen, for example, ammonia, hydrazine, amines (amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary, or quaternary (for example, tetraalkylammonium compounds). A nitrogen-containing reactant can contain heteroatoms other than nitrogen, for example, hydroxylamine, t-butyloxycarbonyl amine, and N-t-butyl hydroxylamine are nitrogen-containing reactants. Example nitrogen-containing reactants include nitrogen gas, ammonia, and amines.

Example silicon-containing reactants used in ALD of metal-containing hard masks include silanes, halosilanes, and aminosilanes. Silicon-containing reactants suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bi(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

In various embodiments, operation 150 is performed at the same substrate temperature as the substrate temperature during operation 130. In some embodiments, the substrate temperature during operation 150 is different from that of operation 130. In various embodiments, operation 150 is performed at the same chamber pressure as the chamber pressure during operation 130. In some embodiments, the chamber pressure during operation 150 is different from the chamber pressure during operation 130. In some embodiments, operation 130 and 150 are performed in the same chamber. In some embodiments, operations 130 and 150 are performed without breaking vacuum. In some embodiments, operations 130 and 150 are performed in different chambers.

Selective deposition of the metal-containing hard mask maintains the space between the features because the surface that is exposed to the metal-containing hard mask deposition precursors is a planar surface having exposed top horizontal surfaces of the features upon which the metal-containing hard mask deposition precursors can nucleate quickly, while the rest of the planar surface is carbon-containing material that has slower nucleation or no nucleation of the metal-containing hard mask deposition precursor.

Figure 4:
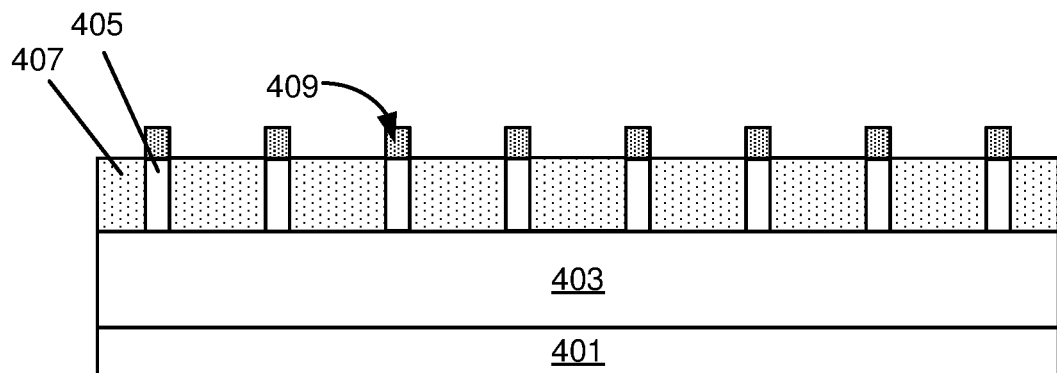

FIG. 4 shows an example substrate 401 having a target layer 403 and features 405 with carbon-containing material 407 filled between features 405 and the metal-containing hard mask 409 deposited selectively on the top horizontal surfaces of the features 405 relative to the carbon-containing material 407.

Returning to FIG. 1, in operation 170, the carbon-containing material is selectively removed relative to the metal-containing hard mask and the features to leave features with the metal-containing hard mask which can then be used to etch a target layer. Selective etch is achieved as the metal-containing hard mask is resilient to a remote oxygen plasma used to etch the carbon-containing material. The carbon-containing material filled between the features may be removed by an ashing operation. The carbon-containing material is removed using a remote oxygen plasma source. In some embodiments, the carbon-containing material is removed by exposing the substrate to oxygen plasma, or hydrogen plasma, or both. In some embodiments, the plasma is a single frequency plasma. The plasma may be a remote plasma, such as one ignited in a remote plasma generator and delivered to a process chamber housing the substrate. In some embodiments, the plasma is an in situ plasma, which may be generated in processing space over the substrate in the process chamber. For in situ plasma embodiments, sputtering of the substrate material is reduced by using a low energy plasma, such as a plasma power between about 50 W and about 250 W (for four 300 mm stations) for a duration between about 1 second and about 10 seconds. In many embodiments, no bias is applied during removal of the carbon-containing material.

Figure 5:
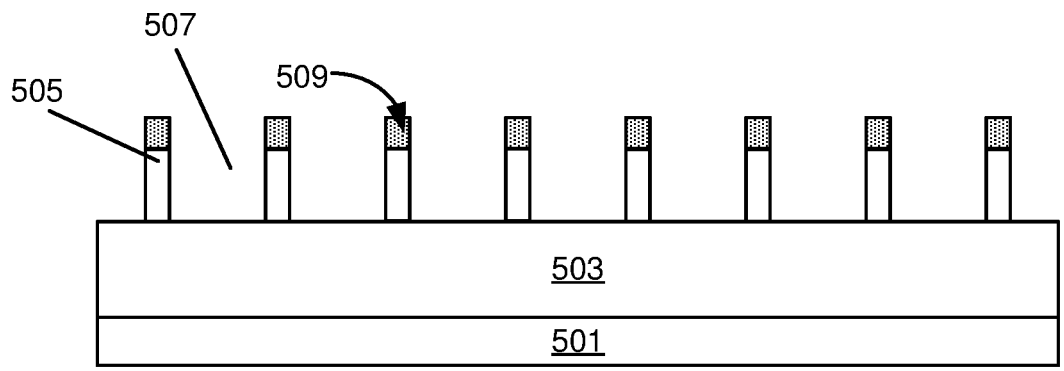

FIG. 5 shows an example substrate 501 having a target layer 503 with spaced apart features 505 with metal-containing hard mask 509 on the top horizontal surfaces of the spaced apart features 505. Example target layer materials include silicon, silicon germanium, silicon carbide, silicon nitride, and silicon oxide. The carbon-containing material has been removed, leaving gaps 507 between the spaced apart features 505. Since the metal-containing hard mask was deposited selectively on the top horizontal surfaces of the spaced apart features 505, the critical dimension of the gaps 507 is maintained. Additionally, no hard mask material is deposited between the space between features as it is filled with carbon-containing material, which also contributes to maintaining the space between the features and maintaining the critical dimension.

Figure 6:
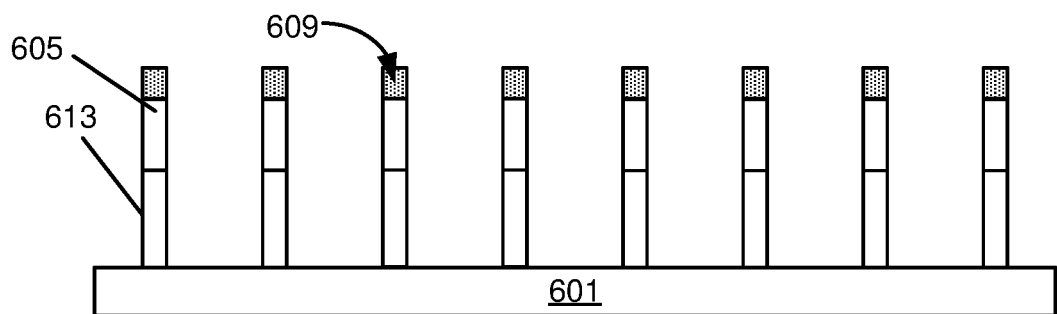

The spaced apart features 505 having the metal-containing hard mask 509 can be subject to etching conditions for etching target layer 503 without substantially degrading the spaced apart features 505. The metal-containing hard mask 509 reduces etch rate in etch conditions when target layer 503 is being etched. For example, FIG. 6 shows an example substrate 501 having an etched target layer 613 according to the pattern of spaced apart features-605 with the metal-containing hard mask 609 on the top horizontal surfaces of the spaced apart features 605 which help maintain the profile of the patterned substrate.

Apparatus

Figure 7:
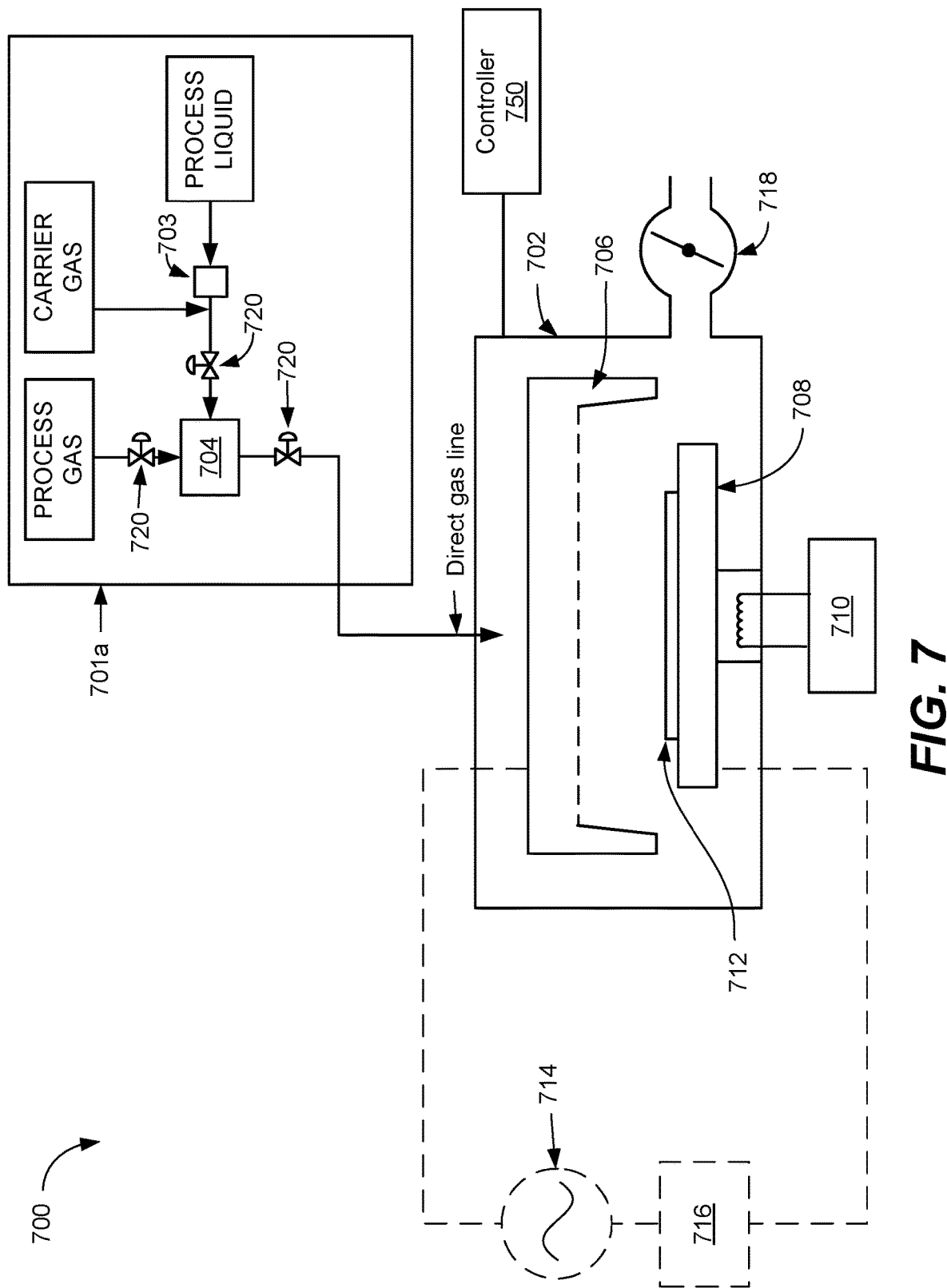
FIG. 7 is a schematic diagram of an example process chamber for performing certain disclosed embodiments.
Figure 8:
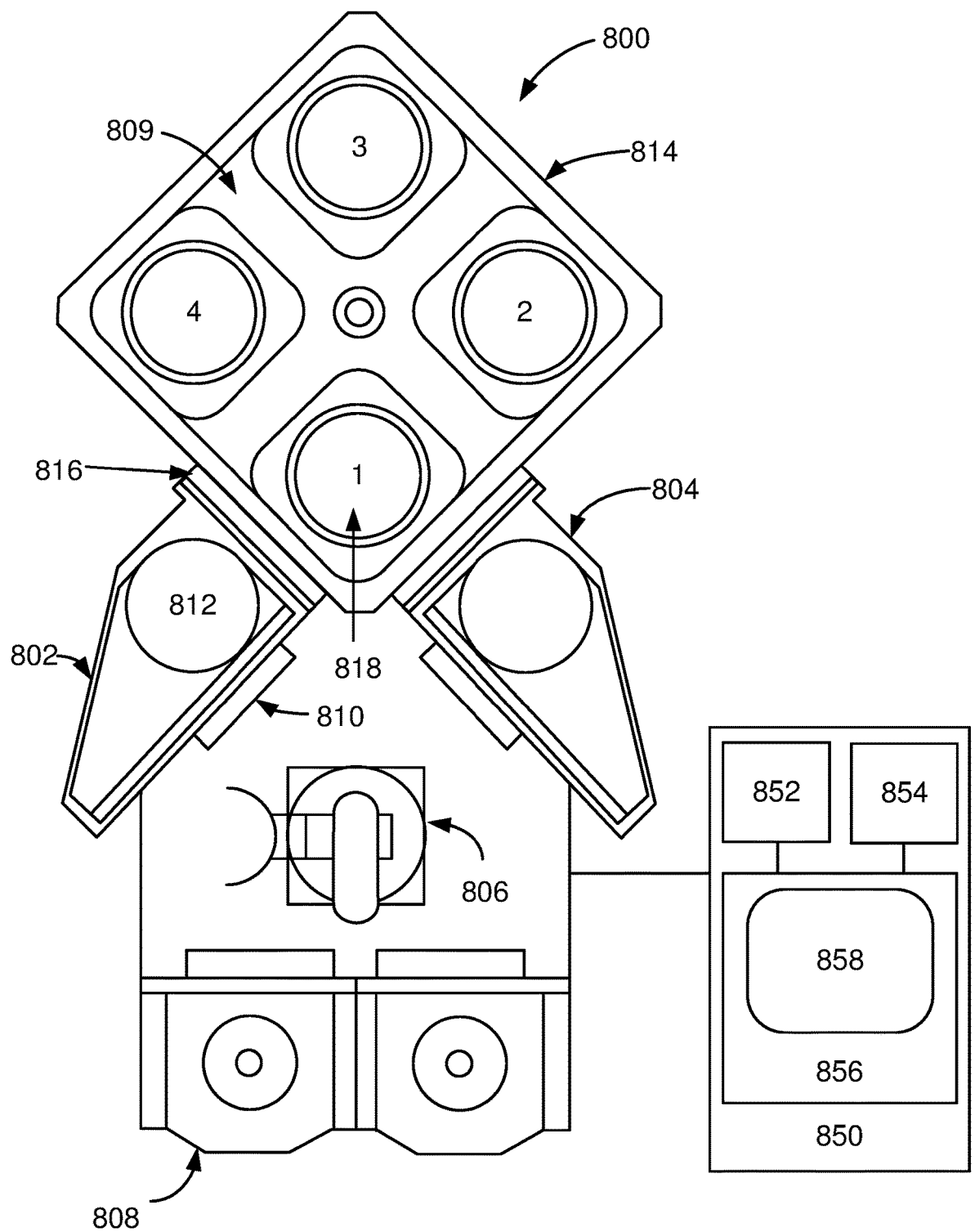
FIG. 8 is a schematic diagram of an example process apparatus for performing certain disclosed embodiments.

FIG. 7 depicts a schematic illustration of an embodiment of a process station 700 having a process chamber body 702 for maintaining a low-pressure environment. A plurality of process stations 700 may be included in a common low pressure process tool environment. For example, FIG. 8 depicts an embodiment of a multi-station processing tool 800. In some embodiments, one or more hardware parameters of process station 700 including those discussed in detail below may be adjusted programmatically by one or more computer controllers 750.

In various embodiments, process station 700 can be used to deposit films by chemical vapor deposition (CVD) or plasma-enhanced chemical vapor deposition (PECVD). For example, carbon-containing material described herein may be deposited using process station 700.

Alternatively or additionally, process station 700 can be used to deposit films by ALD or plasma-enhanced ALD (PEALD). For example, metal-containing hard masks such as tungsten hard masks, tungsten carbide hard masks, or tungsten carbonitride hard masks may be deposited on substrates using process station 700.

Process station 700 fluidly communicates with reactant delivery system 701a for delivering process gases to a distribution showerhead 706. Reactant delivery system 701a includes a mixing vessel 704 for blending and/or conditioning process gases, such as a silicon-containing reactant gas, or tungsten-containing gas, for delivery to showerhead 706. One or more mixing vessel inlet valves 720 may control introduction of process gases to mixing vessel 704.

As an example, the embodiment of FIG. 7 includes a vaporization point 703 for vaporizing liquid reactant to be supplied to the mixing vessel 704. In some embodiments, vaporization point 703 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 703 may be heat traced. In some examples, mixing vessel 704 may also be heat traced. In one non-limiting example, piping downstream of vaporization point 703 has an increasing temperature profile extending from approximately 100° C. to approximately 150° C. at mixing vessel 704.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 703. In one scenario, a liquid injector may be mounted directly to mixing vessel 704. In another scenario, a liquid injector may be mounted directly to showerhead 706.

In some embodiments, a liquid flow controller (LFC) upstream of vaporization point 703 may be provided for controlling a mass flow of liquid for vaporization and delivery to process station 700. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 706 distributes process gases toward substrate 712. In the embodiment shown in FIG. 7, the substrate 712 is located beneath showerhead 706 and is shown resting on a pedestal 708. Showerhead 706 may have any suitable shape, and may have any suitable number and arrangement of ports for distributing process gases to substrate 712.

In some embodiments, pedestal 708 may be raised or lowered to expose substrate 712 to a volume between the substrate 712 and the showerhead 706. It will be appreciated that, in some embodiments, pedestal height may be adjusted programmatically by a suitable computer controller 750.

In another scenario, adjusting a height of pedestal 708 may allow a plasma density to be varied during plasma activation in the process in embodiments where a plasma is ignited. At the conclusion of the process phase, pedestal 708 may be lowered during another substrate transfer phase to allow removal of substrate 712 from pedestal 708.

In some embodiments, pedestal 708 may be temperature controlled via heater 710. In some embodiments, the pedestal 708 may be heated to a temperature of between about 25° C. and about 400° C., or between about 200° C. and about 300° C., during selective deposition of silicon nitride films as described in disclosed embodiments. In some embodiments, the pedestal is set at a temperature between about 75° C. and about 600° C., or at least about 75° C., or between about 200° C. and about 400° C.

Further, in some embodiments, pressure control for process station 700 may be provided by butterfly valve 718. As shown in the embodiment of FIG. 7, butterfly valve 718 throttles a vacuum provided by a downstream vacuum pump (not shown). However, in some embodiments, pressure control of process station 700 may also be adjusted by varying a flow rate of one or more gases introduced to the process station 700.

In some embodiments, a position of showerhead 706 may be adjusted relative to pedestal 708 to vary a volume between the substrate 712 and the showerhead 706. Further, it will be appreciated that a vertical position of pedestal 708 and/or showerhead 706 may be varied by any suitable mechanism within the scope of the present disclosure. In some embodiments, pedestal 708 may include a rotational axis for rotating an orientation of substrate 712. It will be appreciated that, in some embodiments, one or more of these example adjustments may be performed programmatically by one or more suitable computer controllers 750.

In some embodiments where plasma may be used as discussed above, showerhead 706 and pedestal 708 electrically communicate with a radio frequency (RF) power supply 714 and matching network 716 for powering a plasma. For example, plasma may be used to remove organic moieties from the substrate surface after depositing silicon nitride. In some embodiments, the plasma energy may be controlled by controlling one or more of a process station pressure, a gas concentration, an RF source power, an RF source frequency, and a plasma power pulse timing. For example, RF power supply 714 and matching network 716 may be operated at any suitable power to form a plasma.

The plasma power is selected to be low to prevent sputtering of material on the surface of the substrate. RF power supply 714 may provide RF power of any suitable frequency. In some embodiments, RF power supply 714 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 750 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of a hydrocarbon gas, instructions for igniting a plasma, instructions for setting a flow rate of a carrier gas (such as argon), and time delay instructions for the first recipe phase. A second recipe phase may include instructions for setting a flow rate of an inert and/or silicon-containing precursor gas, instructions for setting a flow rate of a carrier gas (such as argon), and time delay instructions for a second recipe phase. A third, subsequent recipe phase may include instructions for modulating or stopping a flow rate of an inert and/or a reactant gas, and instructions for modulating a flow rate of a carrier or purge gas and time delay instructions for the third recipe phase. A fourth recipe phase may include instructions for modulating a flow rate of a tungsten-containing gas, instructions for modulating the flow rate of a carrier or purge gas, and time delay instructions for the fourth recipe phase. A fifth, subsequent recipe phase may include instructions for modulating or stopping a flow rate of an inert and/or a reactant gas, and instructions for modulating a flow rate of a carrier or purge gas and time delay instructions for the fifth recipe phase. It will be appreciated that these recipe phases may be further subdivided and/or iterated in any suitable way within the scope of the disclosed embodiments. In some embodiments, the controller 750 may include any of the features described below with respect to system controller 850 of FIG. 8.

As described above, one or more process stations may be included in a multi-station processing tool. FIG. 8 shows a schematic view of an embodiment of a multi-station processing tool 800 with an inbound load lock 802 and an outbound load lock 804, either or both of which may include a remote plasma source. A robot 806 at atmospheric pressure is configured to move wafers from a cassette loaded through a pod 808 into inbound load lock 802 via an atmospheric port 810. A wafer is placed by the robot 806 on a pedestal 812 in the inbound load lock 802, the atmospheric port 810 is closed, and the load lock is pumped down. Where the inbound load lock 802 includes a remote plasma source, the wafer may be exposed to ambient in the load lock prior to being introduced into a processing chamber 814. Further, the wafer also may be heated in the inbound load lock 802 as well, for example, to remove moisture and adsorbed gases. Next, a chamber transport port 816 to processing chamber 814 is opened, and another robot (not shown) places the wafer into the reactor on a pedestal of a first station shown in the reactor for processing. While the embodiment depicted in FIG. 8 includes load locks, it will be appreciated that, in some embodiments, direct entry of a wafer into a process station may be provided.

The depicted processing chamber 814 includes four process stations, numbered from 1 to 4 in the embodiment shown in FIG. 8. Each station has a heated pedestal (shown at 818 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 814 may include one or more matched pairs of ALD and plasma-enhanced ALD process stations. While the depicted processing chamber 814 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 8 depicts an embodiment of a wafer handling system 890 for transferring wafers within processing chamber 814. In some embodiments, wafer handling system 890 may transfer wafers between various process stations and/or between a process station and a load lock. It will be appreciated that any suitable wafer handling system may be employed. Non-limiting examples include wafer carousels and wafer handling robots. FIG. 8 also depicts an embodiment of a system controller 850 employed to control process conditions and hardware states of process tool 800. System controller 850 may include one or more memory devices 856, one or more mass storage devices 854, and one or more processors 852. Processor 852 may include a CPU or computer, analog, and/or digital input/output connections, stepper motor controller boards, etc.

In some embodiments, system controller 850 controls all of the activities of process tool 800. System controller 850 executes system control software 858 stored in mass storage device 854, loaded into memory device 856, and executed on processor 852. Alternatively, the control logic may be hard coded in the controller 850. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 858 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 800. System control software 858 may be configured in any suitable way. For example, various process tool component subroutines or control objects may be written to control operation of the process tool components used to carry out various process tool processes. System control software 858 may be coded in any suitable computer readable programming language.

In some embodiments, system control software 858 may include input/output control (IOC) sequencing instructions for controlling the various parameters described above. Other computer software and/or programs stored on mass storage device 854 and/or memory device 856 associated with system controller 850 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 818 and to control the spacing between the substrate and other parts of process tool 800.

A process gas control program may include code for controlling gas composition (e.g., hydrocarbon gases, tungsten-containing precursor gases, silicon-containing precursor gases, nitrogen-containing gases, carrier gases, inert gases, and/or purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 850. The user interface may include a display screen, graphical software displays of the apparatus and/or process conditions, and user input devices such as pointing devices, keyboards, touch screens, microphones, etc.

In some embodiments, parameters adjusted by system controller 850 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 850 from various process tool sensors. The signals for controlling the process may be output on the analog and digital output connections of process tool 800. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 850 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 850 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 850.

In some implementations, the system controller 850 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 850, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 850 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 850 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 850, in some implementations, may be a part of or coupled to a computer that is integrated with, coupled to the system, otherwise networked to the system, or a combination thereof. For example, the system controller 850 may be in the "cloud" or all or a part of a fib host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 850 receives instructions in the form of data, which specify parameters for each of the processing steps to be performed during one or more operations. It should be understood that the parameters may be specific to the type of process to be performed and the type of tool that the system controller 850 is configured to interface with or control. Thus as described above, the system controller 850 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 850 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:
1. A method comprising:
providing a patterned semiconductor substrate having features spaced apart on an underlying material to be etched;

filling spaces between the features with an ashable fill such that top horizontal surfaces of the features are exposed and sidewalls of the features contact the ashable fill;

after filling the spaces between the features, selectively depositing a metal-containing hard mask on the exposed top horizontal surfaces of the features relative to the ashable fill; and removing the ashable fill relative to the features and metal-containing hard mask.

2. The method of claim 1, wherein the filling between the features is performed to form a planar surface comprising the top horizontal surfaces of the features and the ashable fill.

3. The method of claim 1, wherein the filling between the features is done by spin-on.

4. The method of claim 3, wherein the spin-on is performed by injecting a carbon-containing fluid mixture onto the patterned semiconductor substrate followed by heat curing.

5. The method of claim 3, wherein the filling between the features is done by spin-on followed by planarization to expose the top horizontal surfaces of the features.

6. The method of claim 1, wherein the filling between the features is done by plasma enhanced chemical vapor deposition.

7. The method of claim 6, wherein the filling between the features further comprises planarizing the patterned semiconductor substrate after the plasma enhanced chemical vapor deposition.

8. The method of claim 6, wherein the filling by plasma enhanced chemical vapor deposition comprises exposing the features to a hydrocarbon precursor having a formula $C_xH_y$, wherein X is an integer between and including 2 and 10, and Y is an integer between and including 2 and 24.

9. The method of claim 1, wherein the selectively depositing of the metal-containing hard mask is performed at a substrate temperature between about 200° C. and about 400° C.

10. The method of claim 1, wherein the selectively depositing of the metal-containing hard mask is performed by one or more cycles of atomic layer deposition.

11. The method of claim 10, wherein one cycle of atomic layer deposition comprises exposure to a silicon-containing precursor and exposure to a tungsten-containing precursor.

12. The method of claim 11, wherein the silicon-containing precursor is silane.

13. The method of claim 11, wherein the tungsten-containing precursor is a tungsten halide.

14. The method of claim 13, wherein the tungsten-containing precursor is selected from the group consisting of tungsten hexafluoride, tungsten pentachloride, tungsten hexachloride, and combinations thereof.

15. The method of claim 1, wherein the features comprise a dielectric material.

16. The method of claim 1, wherein the features comprise silicon.

17. The method of claim 1, wherein the metal-containing hard mask comprises tungsten.

18. The method of claim 17, wherein the metal-containing hard mask is selected from the group consisting of tungsten, tungsten carbide, tungsten carbonitride, and combinations thereof.

19. The method of claim 1, wherein spaces between features have an aspect ratio of at least about 4:1.

* * * * *